United States Patent
Matsuoka

[11] Patent Number: 5,640,033
[45] Date of Patent: Jun. 17, 1997

[54] MOSFET HAVING FINE GATE ELECTRODE STRUCTURE

[75] Inventor: Fumitomo Matsuoka, Kawasaki, Japan

[73] Assignee: Kabushiki Kaisha Toshiba, Tokyo, Japan

[21] Appl. No.: 624,198

[22] Filed: Apr. 3, 1996

Related U.S. Application Data

[63] Continuation of Ser. No. 375,121, Jan. 13, 1995, abandoned, which is a continuation of Ser. No. 89,284, Jul. 8, 1993, abandoned.

[30] Foreign Application Priority Data

Jul. 9, 1992 [JP] Japan ..................... 4-182408

[51] Int. Cl.⁶ .................. H01L 29/76; H01L 29/94
[52] U.S. Cl. ................. 257/333; 257/389; 257/412
[58] Field of Search ......................... 257/288, 327, 257/328, 329, 333, 406, 487, 334, 335, 411, 412

[56] References Cited

U.S. PATENT DOCUMENTS

| | | | |
|---|---|---|---|
| 4,123,771 | 10/1978 | Uchida | 257/324 |
| 4,212,100 | 7/1980 | Daivinen et al. | 257/412 |
| 4,914,500 | 4/1990 | Liu et al. | 257/327 |
| 5,097,301 | 3/1992 | Sanchez | 257/412 |
| 5,182,619 | 1/1993 | Pfiester | 257/900 |

FOREIGN PATENT DOCUMENTS

| | | | |
|---|---|---|---|
| 2036431 | 6/1980 | European Pat. Off. | 257/335 |
| 53-137678 | 12/1978 | Japan | 257/335 |

OTHER PUBLICATIONS

Morimoto et al, "Submicrometer–Gate MOSFET by use of FIBE and Dry Development technique"; IEEE Transactions on Electron Devices, vol. ED–34, No. 2, Feb. 1987 pp. 230–234.

Primary Examiner—Wael Fahmy
Attorney, Agent, or Firm—Loeb & Loeb LLP

[57] ABSTRACT

MOSFET having a fine gate structure comprises a semiconductor substrate of a first conductivity type, source and drain regions of a second conductivity type formed in the semiconductor substrate to define a channel region therebetween, a first insulating film provided over the source region, a second insulating film formed over the first insulating film to provide a side wall, a gate insulating film provided on the semiconductor substrate to cover the channel region, and a gate electrode provided over the gate insulating film to extend to the second insulating film and to cover the side wall. In the structure, the gate electrode is provided to have a thickness for defining an effective channel length at the side wall of the second insulating film.

16 Claims, 4 Drawing Sheets

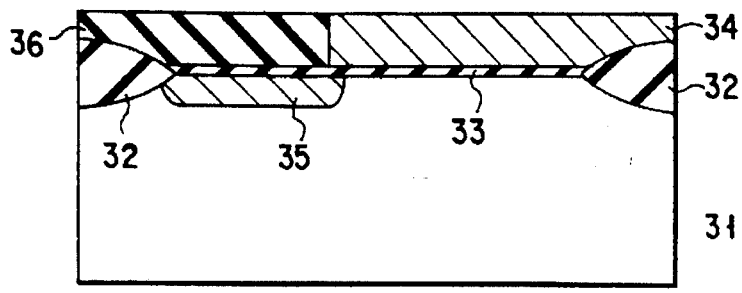
F I G. 2D
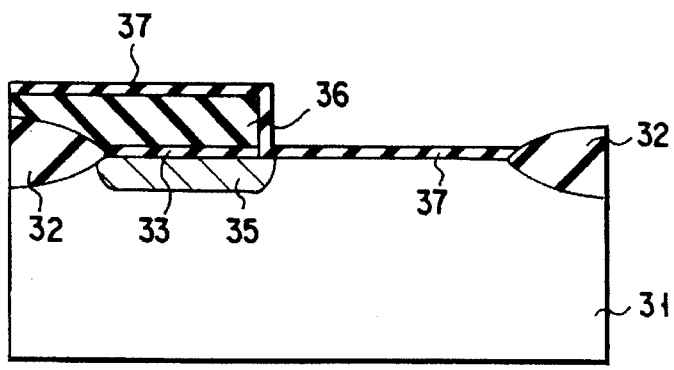
F I G. 2E
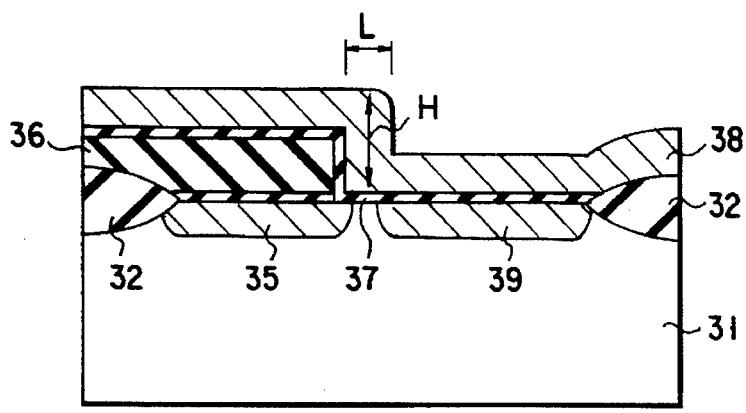
F I G. 2F
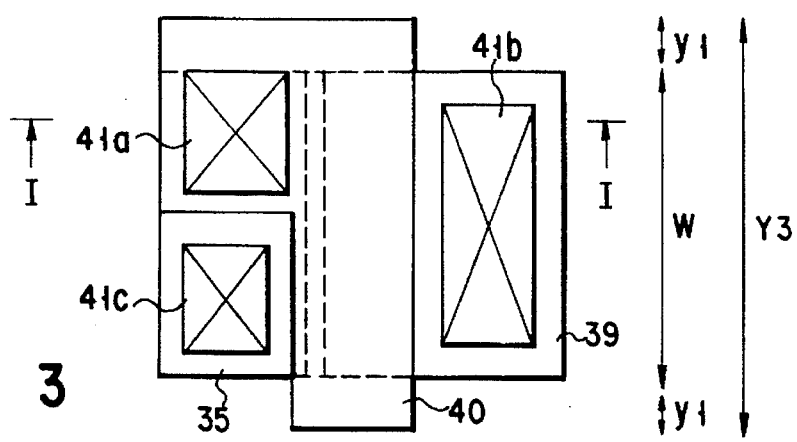
F I G. 3

MOSFET HAVING FINE GATE ELECTRODE STRUCTURE

This is a continuation of application Ser. No. 08/375,121, filed Jan. 13, 1995, now abandoned, which is a continuation of application Ser. No. 08/089,284, filed Jul. 8, 1993, now abandoned.

BACKGROUND OF THE INVENTION

1. Field of the Invention

The present invention relates to a semiconductor device having a fine gate structure and a method of making the same.

2. Description of the Related Art

Recently, with fine pattern structures of integrated circuits, it has been required that gate electrodes of MOSFETs have the fine structure. For example, although variations in gate structures are caused by lithography and anisotropic etching processes, it can not be neglected that electrical characteristics of MOSFETs are affected by the variations.

FIGS. 6A to 6D are sectional views showing process steps of making a conventional MOSFET.

As shown in FIG. 6A, a field oxide film 2 is formed on a surface of a silicon substrate 1 by a selective oxidation process. Thereafter, a gate oxide film 3 with a thickness of about 10 nm is formed on an element region 1a, surrounded by the field oxide film 2, of the surface of the silicon substrate 1 by a thermal oxidation process.

As shown in FIG. 6B, a polysilicon layer 4 with a thickness of approximately 200 nm is deposited over the gate oxide film 3 and the field oxide film 2 by a CVD process. P (phosphorus) is introduced into the polysilicon layer 4 by diffusion or ion implantation techniques. A resist pattern 5 is then formed on the polysilicon layer 4 by photolithographic techniques.

As shown in FIG. 6C, the polysilicon layer 4 and the gate oxide film 3 are anisotropically etched away, using the resist pattern 5 as a mask. Subsequently, ion implantation is performed by using the resist pattern 5 and the field oxide film 2 as masks, forming source and drain regions 6 in the silicon substrate 1 by self-alignment. Thereafter, the resist pattern 5 is removed to provide a gate electrode 7 on the gate oxide film 3.

As shown in FIG. 6D, an $SiO_2$ film 8 of about 300 nm in thickness is deposited over the substrate surface by the CVD process. First and second contact holes 8a and 8b are formed in the $SiO_2$ film 8, and a third contact hole (not shown) is also formed by the photolithographic and anisotropic etching processes. The third contact hole is formed in the field oxide film (not shown). Aluminum wiring layers 9 are connected to the source and drain regions 6 through the contact holes 8a and 8b. The aluminum wiring layer 9 (not shown) is also connected to the gate electrode 7 through the third contact hole.

In the structure, the resist pattern 5 shown in FIG. 6B is formed by the photolithographic technique. In this case, a variation in length $l_1$ of the resist pattern 5 results from the dimensional variation caused by the photolithographic technique, and the value of the variation becomes about 0.05 μm. Therefore, when the gate electrode 7 having the gate length of 0.5 μm is formed, the variation in the gate length caused by the resist pattern 5 reaches 10%.

The gate electrode 7 is formed by the anisotropic etching using the resist pattern 5 as the mask. The anisotropic etching also produces a dimensional variation, leading to a further variation in the gate length. The value of this variation is approximately equal to that of the variation caused by the photolithography.

As a result, when the gate electrode 7 having the gate length 2 of 0.5 μm shown in FIG. 6C, the variation in the gate length reaches about 20% owing to the dimensional variations caused by the photolithography and the anisotropic etching, respectively.

In formation of the gate electrode having the gate length of shorter than 0.35 μm, therefore, the variations resulting from the photolithography and the anisotropic etching are no longer negligible.

Further, it may be considered that a length of the gate electrode in the direction of gate width is decreased to obtain a fine gate electrode. FIG. 7 is a plan view showing a pattern of the MOSFET illustrated in FIG. 6D. Referring to FIG. 7, a length $y_3$ of the gate electrode 7 in the direction of gate width is the sum of a length $y_1$ required for a gate fringe, a length $y_2$ required to provide the third contact hole 8c for connecting the wiring layer to the gate electrode 7, and a gate width $w$. Therefore, in order to reduce the length $y_3$ of the gate electrode 7 in the gate width direction, it may be considered to eliminate the length $y_2$ required for providing the wiring layer.

The third contact hole 8c is formed in the field oxide film in the above conventional MOSFET, but it must be formed in the element region in order to eliminate the length $y_2$. When the contact hole 8c is formed in the element region, however, the gate oxide film may be destroyed by a damage caused by etching it during formation of the contact hole 8c.

SUMMARY OF THE INVENTION

It is, therefore, an object of the present invention to provide a MOSFET having a fine gate structure.

It is another object of the present invention to provide a MOSFET having a short gate length and a small gate electrode in a direction of gate width.

It is still another object of the present invention to provide a method of making the MOSFET having the fine gate structure.

According to one aspect of the present invention, there is provided a MOSFET, which comprises a semiconductor substrate of a first conductivity type, source and drain regions of a second conductivity type formed in the semiconductor substrate to define a channel region therebetween, a first insulating film provided over the source region, a second insulating film formed over the first insulating film to provide a side wall, a gate insulating film provided on the semiconductor substrate to cover the channel region, and a gate electrode provided over the gate insulating film to extend to the second insulating film and to cover the side wall. In this case, the gate electrode is provided to have a thickness for defining an effective channel length.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 2A to 2F are sectional views showing steps of making the MOSFET having the fine gate structure according to the first embodiment of the present invention;

FIG. 3 is a plan view showing the MOSFET illustrated in FIG. 1;

DETAILED DESCRIPTION OF THE PREFERRED EMBODIMENTS

The embodiments of the present invention will be described in detail below with reference to the accompanying drawings.

Figure 1:
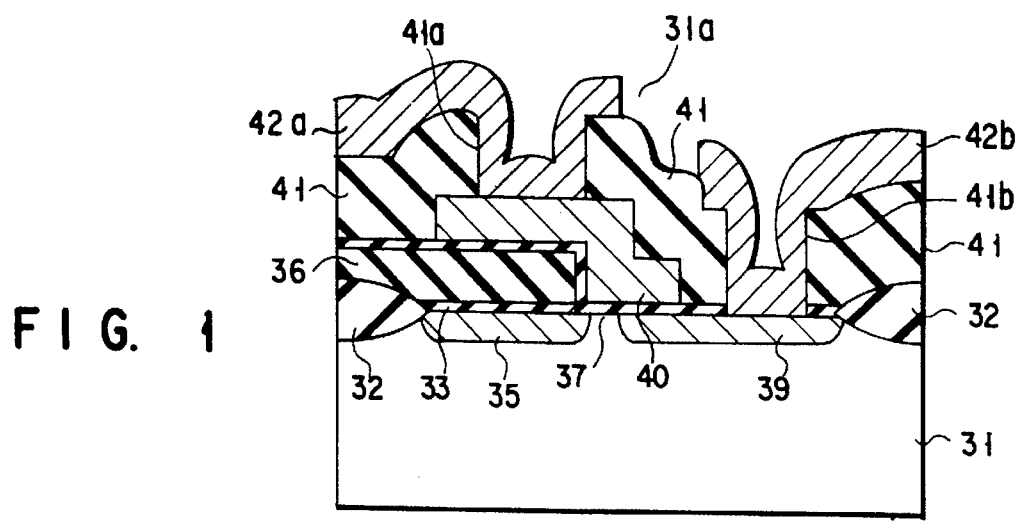
FIG. 1 is a sectional view showing a MOSFET having a fine gate structure according to a first embodiment of the present invention.

FIG. 1 shows a MOSFET having a fine gate structure according to the first embodiment of the present invention. A field oxide film 32 for isolation is formed on a P-type silicon substrate 31 to define an element region 31a. N-type source and drain regions 35 and 39 are formed in the element region 31a to define a channel region therebetween. A first insulating film 33 and a second insulating film 36 are provided on the source region 35 except the channel region, thereby forming a step height having a predetermined thickness between the substrate surface and the second insulating film 36. A gate insulating film 37 is formed on the drain region 39 so as to cover the channel region. A gate electrode 40 is provided over the gate insulating film 37 to extend to the second insulating film 36 through the step height. In this case, the thickness of the gate electrode 40 is provided so as to define the channel length. After the substrate surface is covered with a third insulating film 41, a gate electrode 42a, a drain electrode 42b, and a source electrode (not shown) 41c are provided through contact holes 41a and 41b.

A method of making the MOSFET will be described below with reference to FIGS. 2A to 2F.

Figure 2A:
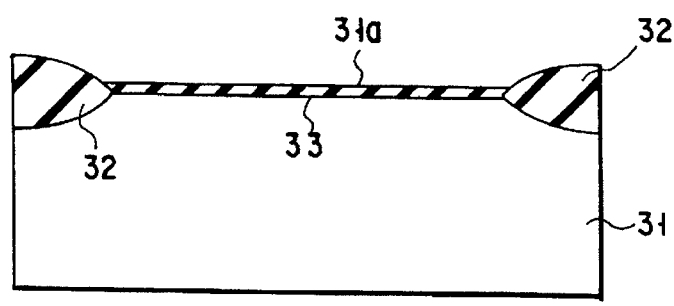

First, as shown in FIG. 2A, the field oxide film 32 for isolation is formed on the surface of the p-type silicon substrate 31 by a selective oxidation process or the like. The silicon oxide film 33 with a thickness of about 10 nm is formed on the element region 31a surrounded by the field oxide film 32 by e.g., thermal oxidation.

Figure 2B:
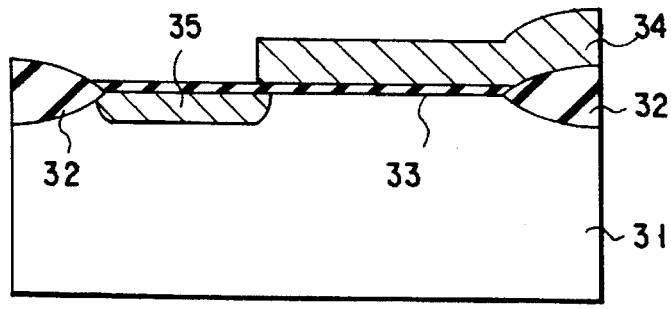

Thereafter, as shown in FIG. 2B, a first polysilicon film 34 with a thickness of approximately 200 nm is deposited over the silicon oxide film 33 and the field oxide film 32 by CVD techniques. The polysilicon film 34 is selectively removed by photolithographic techniques to form a portion corresponding to one side edge of a gate electrode (described later). Subsequently, using the polysilicon film 34 as a mask, As is implanted into the substrate 31 at an acceleration voltage of 40 KeV and a dose of $5 \times 10^{15}$ cm$^{-2}$, forming the N-type source region 35.

Figure 2C:
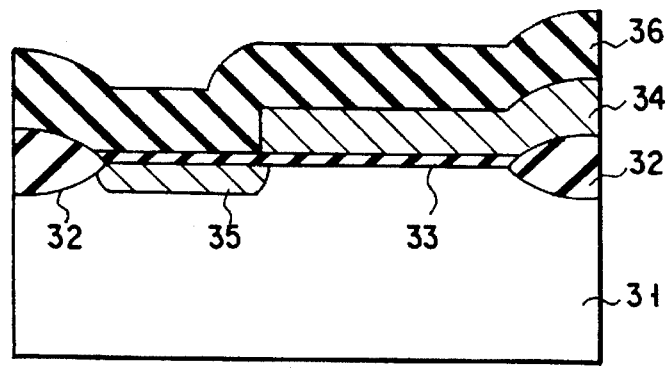

As shown in FIG. 2C, an SiO$_2$ film 36 with a thickness of about 500 nm is deposited on the silicon oxide film 33, the first polysilicon film 34, and the field oxide film 32 by the CVD technique.

As shown in FIG. 2D, the SiO$_2$ film 36 is etched back until the surface of the first polysilicon film 34 is exposed.

As shown in FIG. 2E, the first polysilicon film 34 and the silicon oxide film 33 are removed. Thereafter, the gate oxide film 37 of about 10 nm in thickness is formed on the exposed surface of the silicon substrate 31 by thermal oxidation.

In this case, the SiO$_2$ film 36 must be five times or more as thick as the gate oxide film 37.

As shown in FIG. 2F, a second polysilicon film 38 with a thickness of approximately 100 nm is deposited over the gate oxide film 37. Subsequently, As is ion-implanted into the second polysilicon film 38 at an acceleration voltage of 30 KeV and a dose of about $5 \times 10^{15}$ cm$^{-2}$. Thereafter, when ion implantation of As is carried out at an acceleration voltage of 80 KeV and a dose of approximately $5 \times 10^{15}$ cm$^{-2}$, an N-type drain region 39 is formed in the silicon substrate 31, using a part of the polysilicon film 38, provided at the side wall of the SiO$_2$ film 36, as a mask.

That is, the As ions thus implanted reach the silicon substrate 31 through the second polysilicon film 38 having a thickness of about 100 nm. Since, however, the SiO$_2$ film 36 with a thickness of approximately 200 nm is provided on the source region 35, the implanted As ions are blocked by the SiO$_2$ film 36 and hence do not reach the source region 35. Further, in the side wall portion of the second polysilicon film 38, a thickness H of the step height is the sum of the thickness of the SiO$_2$ film 36 and the thickness of the second polysilicon film 38, i.e., given by about a 600 nm. No As ions reach the silicon substrate 31 in that portion. Therefore, the drain region 39 is provided in the silicon substrate 31 shown in FIG. 2F. Consequently, a gate length L of the gate electrode 40 (described later) becomes equal to the thickness of the second polysilicon film 38.

Thereafter, as shown in FIG. 1, the second polysilicon film 38 is selectively removed by the photolithographic technique to form the gate electrode 40. An interlevel insulator 41 of SiO$_2$ is formed over the substrate surface by the CVD process. The first and second contact holes 41a and 41b and the third contact hole (not shown) are formed in the interlevel insulator 41 by a known manner. The aluminum contacts 42a and 42b having a thickness of about 500 nm are formed in the contact holes 41a and 41b and on the interlevel insulator 41.

FIG. 3 is a plan view showing the pattern of the MOSFET illustrated in FIG. 1. The aluminum contact 42a is electrically connected to the gate electrode 40 through the first contact hole 41a, and the aluminum contact 42b is electrically connected to the drain region 39 through the second contact hole 41b. The aluminum contact (not shown) is electrically connected to the source region 35 through the third contact hole 41c.

The gate length $y_3$ of the gate electrode 40 in the direction of gate width is the sum of the length $y_1$ required for the margin of the gate fringe, and the gate width $\underline{w}$.

According to the embodiment, after the second polysilicon film 38 is deposited over the gate oxide film 37 so as to extend to the SiO$_2$ film 36, As ions are implanted into the silicon substrate 31, thereby providing the drain region 39. For this reason, the gate length L is determined by only the thickness of the second polysilicon film 38 and is therefore free from the influence of dimensional variations caused by the photolithographic and anisotropic etching processes unlike in the conventional manufacturing method. This makes it possible to provide the gate length L which is shorter than the limit of fine patterning performed by the lithographic technique and is less fluctuation. This also makes stable formation of the gate electrode 40 with the high reliability.

In addition, since the source region 35 and the drain region 39 are formed through separate ion implantation processes, the degree of freedom in controlling the shapes of the regions can be improved.

Furthermore, the gate electrode 40 disposed in the element region 31a extends to the $SiO_2$ film 36. Further, the first contact hole 41a is formed in the interlevel insulator 41. During the formation of the contact hole 41a, therefore, the contact from the gate electrode 40 can be provided above the element region 31a without causing any damage to the gate oxide film 37 by etching. As shown in FIG. 3, therefore, it is unnecessary to provide a length for forming the contact hole 41a for connecting the wiring layer to the gate electrode, which is required for the direction of gate width in the conventional MOSFET, and consequently the length $y_3$ of the gate electrode 40 in the direction of gate width can be decreased. The fine patterning of the gate electrode 40 is also advantageous in decreasing the area of an element.

Moreover, As is used as an impurity for the source region 35 and the drain region 39 in the embodiment, but P may be employed.

In addition, although As is ion-implanted into the second polysilicon film 38 in the embodiment, B or P can also be ion-implanted or thermally diffused.

Furthermore, in the above embodiment, after the second polysilicon film 38 is deposited over the gate oxide film 37 and the field oxide film 32, As is ion-implanted into the silicon substrate 31 to provide the drain region 39. It is, however, also possible to provide an LDD structure by forming a drain region by ion-implanting P at a dose of about $10^{14}$ $cm^{-2}$ into the silicon substrate after the second polysilicon film is deposited, forming a gate electrode by selectively removing the second polysilicon film, and implanting As at a dose of $10^{15}$ cm-2 or more by using the gate electrode as a mask.

Moreover, the present invention is also similarly applicable to fabrication of P-channel MOSFETs.

Figure 4:
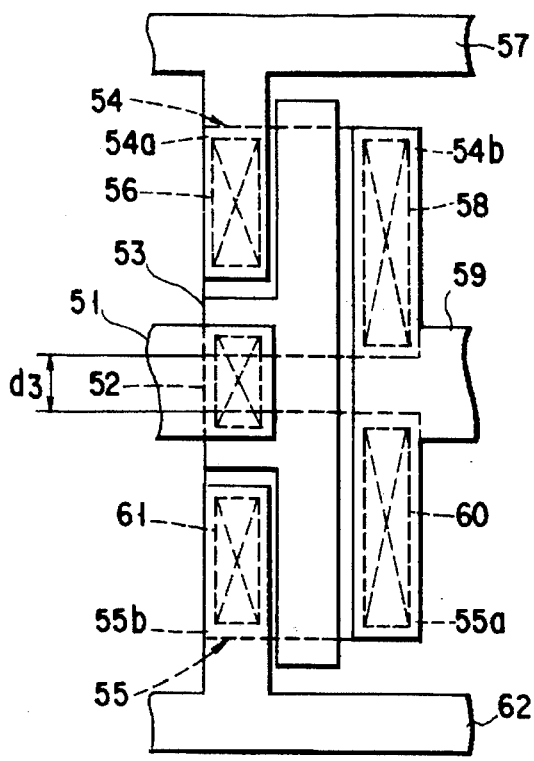
FIG. 4 is a plan view showing a CMOSFET having a fine gate structure according to a second embodiment of the present invention.

FIG. 4 is a plan view showing a pattern of a CMOSFET according to the second embodiment of the present invention. A first wiring layer 51 is electrically connected to a gate electrode 53 via a first contact portion 52. This first contact portion 52 is provided over the element regions of N- and P-channel MOSFETs 54 and 55 and a field oxide film. A source region 54a of the N-channel MOSFET 54 is electrically connected to a second wiring layer 57 via a second contact portion 56. A drain region 54b of the N-channel MOSFET 54 is electrically connected to a third wiring layer 59 via a third contact portion 58. The third wiring layer 59 is electrically connected to a drain region 55a of the P-channel MOSFET 55 via a fourth contact portion 60. A source region 55b of the P-channel MOSFET 55 is electrically connected to a fourth wiring layer 62 via a fifth contact portion 61.

Figure 5:
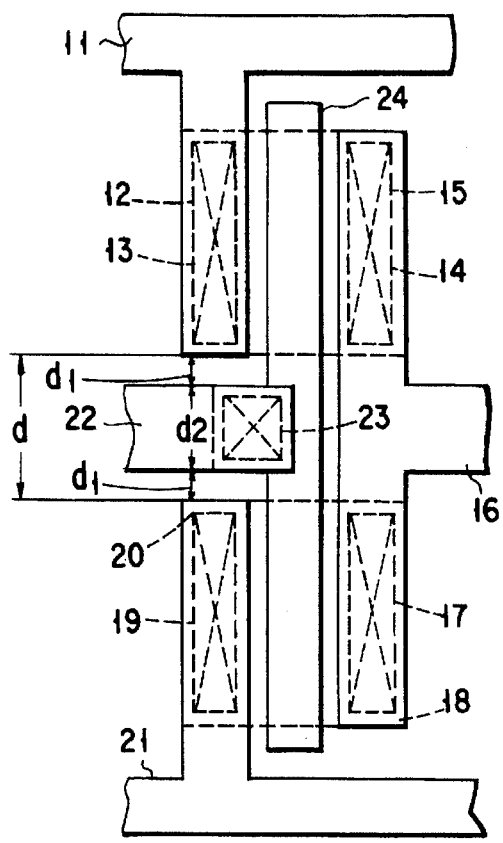
FIG. 5 is a plan view showing a conventional CMOSFET.
Figure 6A:
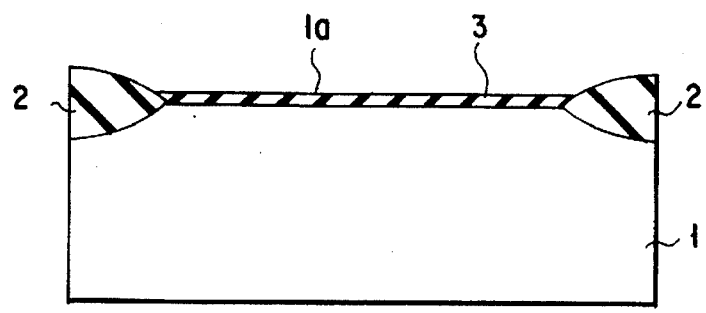
FIGS. 6A to 6D are sectional views showing steps of making the conventional MOSFET.
Figure 6B:
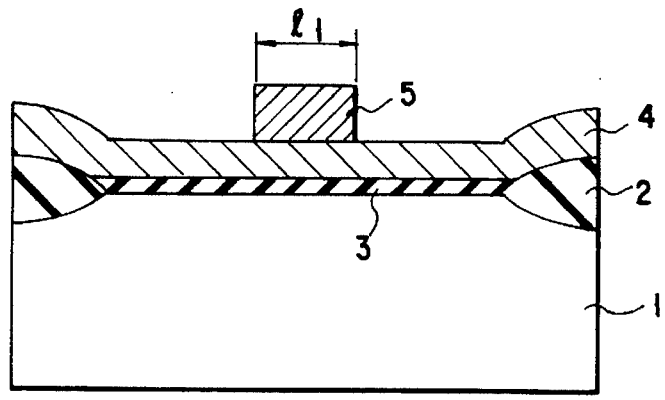
Figure 6C:
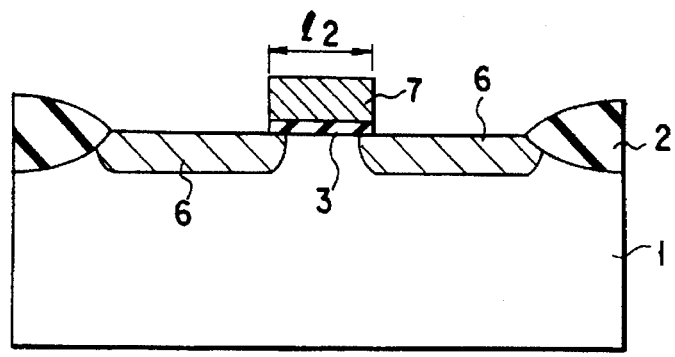
Figure 6D:
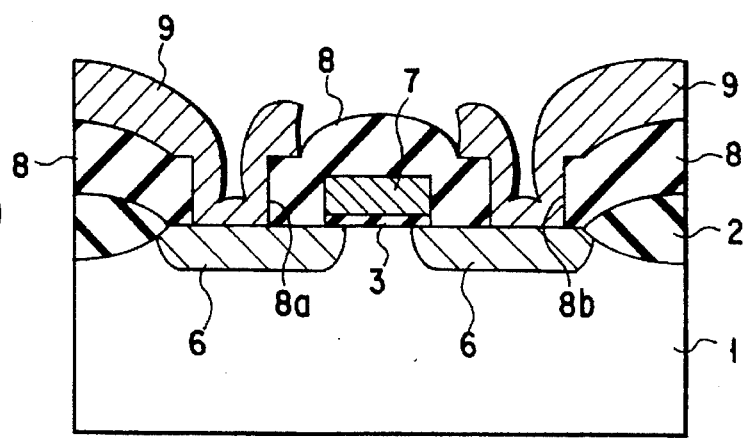
Figure 7:
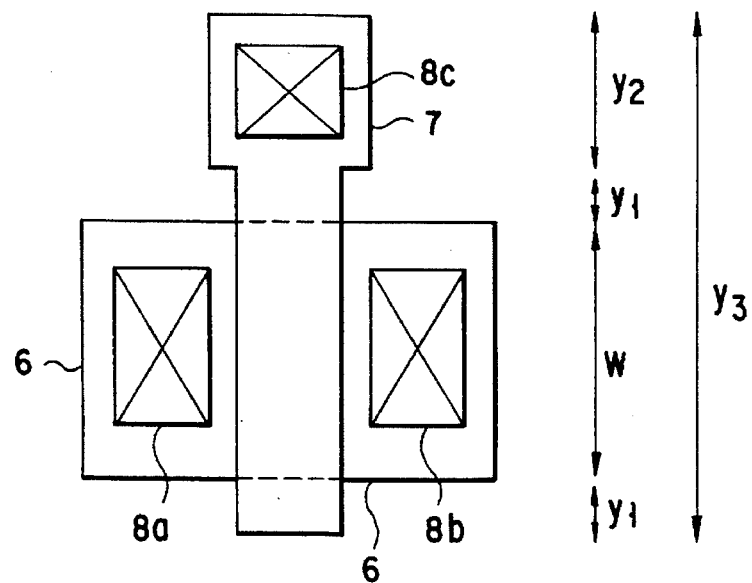
FIG. 7 is a plan view showing a pattern of the MOSFET illustrated in FIG. 6D.

FIG. 5 is a plan view showing a pattern of a conventional CMOSFET. A first wiring layer 11 is electrically connected to a source region 13 of an N-channel MOSFET via a first contact portion 12. A drain region 14 of the N-channel MOSFET is electrically connected to a second wiring layer 16 via a second contact portion 15. The second wiring layer 16 is electrically connected to a drain region 18 of a P-channel MOSFET via a third contact portion 17. A source region 19 of the P-channel MOSFET is electrically connected to a third wiring layer 21 via a fourth contact portion 20. A fourth wiring layer 22 is electrically connected to a gate electrode 24 of the N- and P-channel MOSFETs via a fifth contact portion 23 which is formed in a field oxide film. Therefore, a distance $\underline{d}$ between the source region 13 of the N-channel MOSFET and the source region 19 of the P-channel MOSFET is the sum of a distance $d_1$ required for a margin of a gate fringe and a distance $d_2$ required to form the fifth contact portion 23.

In the above conventional CMOSFET, the gate electrode and the wiring layer cannot be connected above the element region to each other. In the CMOSFET according to the second embodiment, however, the first contact portion 52 can be provided above the element region 31a. Consequently, a distance $d_3$ between the source region 54a of the N-channel MOSFET 54 and the source region 55b of the P-channel MOSFET 55 is a length required for the margin between the source regions 54a and 55b. Since, therefore, the length of the gate electrode in the direction of gate width can be decreased to be smaller than that in the conventional semiconductor device, the same advantage as in the first embodiment can also be obtained in the second embodiment.

It is further understood by those skilled in the art that the foregoing description is only of the preferred embodiments and that various changes and modifications may be made in the invention without departing from the spirit and scope thereof.

What is claimed is:

1. A MOS type field effect transistor (MOSFET) comprising:

a semiconductor substrate of a first conductivity type;

source and drain regions of a second conductivity type formed in said semiconductor substrate to provide a channel region therebetween;

a first insulating film provided substantially over said source region;

a second insulating film formed over said first insulating film to provide a side wall having a step height;

a gate insulating film provided on said semiconductor substrate to cover said channel region; and a gate electrode provided over said gate insulating film extending to said second insulating film and covering said side wall, said gate electrode having an upper horizontally extending portion above the source region: a vertically extending portion located along said side wall, and a lower horizontally extending portion above the drain region, wherein the vertically extending portion has a critical thickness, the critical thickness being a horizontal thickness of the vertically extending portion of said gate electrode that is located along the sidewall below a bottom surface of the upper horizontally extending portion of said gate electrode and above an upper surface of the lower horizontally extending portion of said gate electrode, and an effective channel length of the MOSFET is substantially equal to the critical thickness of the vertically extending portion of said gate electrode.

2. The MOS type field effect transistor according to claim 1, wherein said second insulating film is thicker than said first insulating film.

3. The MOS type field effect transistor according to claim 1, wherein a thickness of said gate insulating film is approximately equal to that of said first insulating film.

4. The MOS type field effect transistor according to claim 1, wherein said second insulating film is at least five times as thick as said gate insulating film.

5. The MOS type field effect transistor according to claim 1, further comprising:

a third insulating film formed above said gate electrode;

a hole formed in said third insulating film in the region directly above said second insulating film; and a conductive electrode formed in contact with said gate electrode through said hole in said third insulating film.

6. A MOS device comprising:

a substrate of a first conductivity type;

a first doping region having a conductivity type opposite to said first conductivity type formed within said substrate, wherein a portion of an interface between said first doping region and said substrate near a surface of said substrate defines a first doping region edge;

a second doping region having a conductivity type opposite to said first conductivity type formed within said substrate, wherein a portion of an interface between said second doping region and said substrate near a surface of said substrate defines a second doping region edge;

a channel region within said substrate defined by said first doping region edge and said second doping region edge;

a gate insulating film formed over said channel region;

a first insulating film substantially thicker than said gate insulating film, said first insulating film having a side wall located adjacent to said first doping region edge and extending above said first doping region; and a gate electrode disposed over said first insulating film and said gate insulating film, said gate electrode extending over said side wall of said first insulating film so that said gate electrode has an upper horizontally extending portion above the first doping region, a vertically extending portion located along said side wall, and a lower horizontally extending portion above the second doping region, wherein said gate electrode defines a MOS gate adjacent to said side wall of said first insulating film, and said MOS device is characterized by an effective channel length substantially equal to a horizontal thickness of the vertically extending portion of said gate electrode that is located along said side wall below a level of a bottom surface of the upper horizontally extending portion of said gate electrode and above a level of an upper surface of the lower horizontally extending portion of said gate electrode.

7. The MOS device of claim 6 further comprising:

a contact hole formed above said first insulating film; and a conductive electrode formed on said gate electrode through said contact hole.

8. The MOS device of claim 6 wherein said effective channel length of said MOS device is determined by forming said second doping region edge by using said vertically extending portion of said gate electrode as a mask.

9. The MOS device of claim 8 wherein said first insulating film is at least five times as thick as said gate insulating film.

10. The MOS device of claim 8, wherein said channel length is less than approximately 0.35 microns.

11. The MOS device of claim 8 wherein said gate electrode comprises polysilicon doped with an impurity species, wherein said second doping region is also doped with said impurity species.

12. A MOS type field effect transistor comprising:

a semiconductor substrate of a first conductivity type;

source and drain regions of a second conductivity type formed in said semiconductor substrate to provide a channel region therebetween;

a first insulating film provided over said source region;

a second insulating film formed over said first insulating film to provide a side wall having a step height;

a gate insulating film provided on said semiconductor substrate to cover said channel region; and a gate electrode provided over said gate insulating film and extending to cover at least a portion of said second insulating film, wherein said gate electrode includes a vertically extending portion that is located along said side wall, wherein an edge of said drain region is aligned with one vertical edge of said vertically extending portion of said gate electrode and an edge of said source region is aligned with another vertical edge of said vertically extending portion of said gate electrode.

13. A MOS type field effect transistor (MOSFET) comprising:

a semiconductor substrate of a first conductivity type;

source and drain regions of a second conductivity type formed in said semiconductor substrate to provide a channel region therebetween;

an insulating layer provided over said source region to provide a side wall having a step height;

a gate insulating film provided on said semiconductor substrate to cover said channel region; and a gate electrode provided over said gate insulating film and at least part of said insulating layer, said gate electrode having a vertically extending portion that is located along said side wall, wherein one vertical edge of said drain region is aligned with one vertical edge of said vertically extending portion and one vertical edge of said source region is aligned with another vertical edge of said vertically extending portion so that the effective channel length of the MOSFET is substantially equal to a horizontal distance from the one vertical edge of said vertically extending portion the other vertical edge of said vertically extending portion.

14. The MOS type field effect transistor (MOSFET) as defined in claim 13, wherein the insulating layer is formed by a plurality of insulating films.

15. The MOS type field effect transistor (MOSFET) as defined in claim 1, wherein the effective channel length of the MOSFET is equal to the critical thickness.

16. The MOS device as defined in claim 6, wherein the effective channel length is equal to a horizontal thickness of the vertically extending portion of said gate electrode that is located along said side wall below a level of a bottom surface of the upper horizontally extending portion of said gate electrode and above a level of an upper surface of the lower horizontally extending portion of said gate electrode.

* * * * *